United States Patent
Van Lanen et al.

(10) Patent No.: US 11,651,919 B2
(45) Date of Patent: May 16, 2023

(54) SYSTEM FOR CONTROLLING TEMPERATURE OF PERSISTENT CURRENT SWITCH

(71) Applicant: KONINKLIJKE PHILIPS N.V., Eindhoven (NL)

(72) Inventors: Ezra Petrus Antonius Van Lanen, Niskayuna, NY (US); Philippe Abel Menteur, Niskayuna, NY (US); John Arthur Urbahn, Saratoga Springs, NY (US)

(73) Assignee: Koninklijke Philips N.V., Eindhoven (NL)

( * ) Notice: Subject to any disclaimer, the term of this patent is extended or adjusted under 35 U.S.C. 154(b) by 50 days.

(21) Appl. No.: 17/441,582

(22) PCT Filed: Mar. 20, 2020

(86) PCT No.: PCT/EP2020/057804
§ 371 (c)(1),
(2) Date: Sep. 21, 2021

(87) PCT Pub. No.: WO2020/193415
PCT Pub. Date: Oct. 1, 2020

(65) Prior Publication Data
US 2022/0172917 A1 Jun. 2, 2022

Related U.S. Application Data

(60) Provisional application No. 62/822,100, filed on Mar. 22, 2019.

(51) Int. Cl.
*H01H 50/12* (2006.01)
*F25B 9/10* (2006.01)
(Continued)

(52) U.S. Cl.
CPC ............ *H01H 50/12* (2013.01); *F16K 31/062* (2013.01); *F25B 9/10* (2013.01); *F25D 19/006* (2013.01); *H01H 50/44* (2013.01)

(58) Field of Classification Search
CPC ...... H01H 50/12; H01H 50/44; F16K 31/062; F25B 9/10; F25D 19/006; F25D 19/00;
(Continued)

(56) References Cited

U.S. PATENT DOCUMENTS 1,699,143 A * 1/1929 Hill .................. G05D 23/27539
236/44 R
3,872,953 A * 3/1975 Taylor ..................... B60T 11/18
477/198

(Continued)

FOREIGN PATENT DOCUMENTS

JP          08138928 A      5/1996
JP       2009246231 A     10/2009
(Continued)

OTHER PUBLICATIONS

International Search Report and Written Opinion From PCT/EP2020/057804 dated Oct. 1, 2020.

*Primary Examiner* — Mary E McManmon
*Assistant Examiner* — Andrew J Rost

(57) ABSTRACT

A system (100) for controlling temperature of a persistent current switch (120) operating in a background magnetic field includes a heat exchanger (138), a loop tube (135), a ball valve (245) and multiple electromagnets (251, 252). The heat exchanger disperses heat to a cryocooler (106). The loop tube enables flow of coolant to convectively transfer thermal energy generated by the persistent current switch to the heat exchanger. The ball valve is integrated with the loop tube between the persistent current switch and the heat exchanger, and contains a ferromagnetic ball (250). The electromagnets are positioned outside the loop tube adjacent (Continued)

to the ball valve, where energizing a first electromagnet of the multiple electromagnets magnetically moves the ferromagnetic ball to a first position opening the loop tube and enabling the flow of the coolant, and energizing a second electromagnets magnetically moves the ferromagnetic ball to a second position closing the loop tube and blocking the flow of the coolant.

20 Claims, 5 Drawing Sheets

(51) Int. Cl.
    *F25D 19/00*     (2006.01)
    *H01H 50/44*     (2006.01)
    *F16K 31/06*     (2006.01)

(58) Field of Classification Search
    CPC . H01L 39/16; G01R 33/3804; G01R 33/3815; H01F 6/04
    See application file for complete search history.

(56) References Cited

U.S. PATENT DOCUMENTS

| | | | |
|---|---|---|---|
| 5,394,129 A | 2/1995 | Obasih et al. | |
| 8,851,449 B2 * | 10/2014 | Neuhaus | F16K 31/0651 |
| | | | 251/129.21 |
| 2015/0323626 A1 * | 11/2015 | Jonas | G01R 33/3815 |
| | | | 324/322 |
| 2015/0346296 A1 * | 12/2015 | Biber | G01R 33/3815 |
| | | | 62/51.1 |
| 2016/0116555 A1 | 4/2016 | Nemoto | |
| 2016/0189842 A1 | 6/2016 | Jonas et al. | |

FOREIGN PATENT DOCUMENTS

| | | |
|---|---|---|
| WO | 2014096995 A1 | 6/2014 |
| WO | 2015011679 A1 | 1/2015 |
| WO | 2018003420 A1 | 4/2018 |

\* cited by examiner

SYSTEM FOR CONTROLLING TEMPERATURE OF PERSISTENT CURRENT SWITCH

CROSS REFERENCE TO RELATED APPLICATIONS

This application is a U.S. national phase application of International Application No. PCT/EP2020/057804 filed on Mar. 20, 2020, which claims the benefit of U.S. Provisional Application Ser. No. 62/822,100 filed on Mar. 22, 2019 and is incorporated herein by reference.

BACKGROUND

Superconducting magnets may be used in systems that require strong magnetic fields, such as magnetic resonance imaging (MRI) and nuclear magnetic resonance (NMR) spectrometry, for example. To realize superconductivity, a magnet includes one or more electrically conductive coils formed superconducting wire, and is maintained in a cryogenic environment at a temperature near absolute zero during operation. In the superconducting state, the electrically conductive coils are referred to as superconducting coils, which effectively have no electrical resistance, and therefore conduct much larger electric currents to create the strong magnetic fields. Operation of a superconducting magnet in the superconducting state may be referred to as persistent current mode. That is, the persistent current mode is the state in which an electrical circuit (e.g., including superconducting coils) can carry electrical current substantially indefinitely and without the need for an external power source due to the absence of electrical resistance.

To operate in the persistent current mode, the superconducting magnet provides a closed superconducting circuit with a superconducting loop. This circuit is interrupted to allow a power source to drive electrical current into the coils. Interrupting the circuit typically includes warming up a section of the superconducting loop, so that the superconducting loop develops an electrical resistance. The component of the superconducting circuit responsible for switching between the superconducting state and normal (non-superconducting) resistance is called a magnet persistent current switch (PCS). When a voltage source is connected across the PCS, most of the current will flow into the coils, and only a small current will flow through the now resistive wires of the PCS. Both the action of opening the PCS and applying voltage across it cause the PCS to generate heat. A low temperature cooling system (cryostat), which also cools the superconducting coils, cannot cope with the additional heat generated by the PCS when the cooling system has a limited capacity to absorb or take away that heat. This is the case in so-called cryogen free, or sealed systems, which require that the PCS be thermally disconnected from the cooling system while the magnet is energized or de-energized.

Accordingly, there is a need for a cooling system that allows the temperature of a magnet PCS to rise and fall as desired within seconds, without straining the cooling system for the superconducting coils.

SUMMARY

According to a representative embodiment, a system for controlling temperature of a persistent current switch operating in a background magnetic field includes a heat exchanger, a loop tube, and a thermal switch. The heat exchanger is configured to disperse heat. The loop tube is configured to enable flow of coolant to convectively transfer thermal energy generated by the persistent current switch to the heat exchanger. The thermal switch includes a ball valve integrated with the loop tube between the persistent current switch and the heat exchanger, the ball valve containing a ferromagnetic ball having a diameter greater than an inner diameter of an opening of the loop tube, or of an orifice in the ball valve adjoining the opening of the loop tube, and multiple electromagnets positioned outside the loop tube adjacent to the ball valve. Energizing a first electromagnet of the multiple electromagnets magnetically moves the ferromagnetic ball to a first position opening the loop tube and enabling the flow of the coolant. Energizing a second electromagnet of the multiple electromagnets magnetically moves the ferromagnetic ball to a second position closing the loop tube and blocking the flow of the coolant. The background magnetic field in which the system operates may interfere with its function. Accordingly, the system may be located in an area of the background magnetic field where the background magnetic field is small enough for the electromagnets, when energized, to overcome any magnetic force on the ferromagnetic ball. Alternatively or in addition, an optional ferromagnetic shield may be mounted around the ball valve and the electromagnets if the location of the system and/or other means of protection from the background magnetic field are inadequate.

According to another representative embodiment, a system is provided for controlling transfer of thermal energy of a persistent current switch to a heat exchanger in thermal contact with a cryocooler. The system includes a loop tube positioned between the persistent current switch and the heat exchanger, wherein coolant selectively flows through the loop tube; a first ball valve on a first part of the loop tube between the persistent current switch and the heat exchanger, the first ball valve containing a first ferromagnetic ball, a first orifice adjoining a first opening of a first part of the loop tube, and a first notch adjacent to the first orifice; a second ball valve on a second part of the loop tube between the persistent current switch and the heat exchanger, the second ball valve containing a second ferromagnetic ball, a second orifice adjoining a second opening of a second part of the loop tube, and a second notch adjacent to the second orifice; a first solenoid and a second solenoid positioned outside the first part of the loop tube adjacent to the first ball valve; and a third solenoid and a fourth solenoid positioned outside the second part of the loop tube adjacent to the second ball valve. The coolant is able to flow through the loop tube by energizing the first and second solenoids such that the first and second ferromagnetic balls move to the first and second notches, respectively, opening the first and second parts of the loop tube. The coolant is blocked from flowing through the loop tube by energizing the second and fourth solenoids such that the first and second ferromagnetic balls move to the first and second orifices, respectively, closing off the first and second parts of the loop tube.

According to another representative embodiment, a system is provided for controlling transfer of thermal energy of a persistent current switch operating in a background magnetic field to a heat exchanger in thermal contact with a cryocooler. The system includes a loop tube positioned between the persistent current switch and the heat exchanger, where coolant selectively flows through the loop tube; a ball valve in the loop tube between the persistent current switch and the heat exchanger, the ball valve containing a ferromagnetic ball having a diameter greater than an inner diameter of the loop tube, or orifice adjoining an opening of the loop tube; a first solenoid positioned outside the loop tube adjacent to a first side of the ball valve; and a second solenoid positioned outside the loop tube adjacent to a second side of the ball valve. The loop tube includes a first end portion formed of a ferromagnetic material that partially extends into the first side of the ball valve, and a second end portion formed of the ferromagnetic material that partially extends into the second side of the ball valve, the first end portion defining one or more through-holes in sidewalls of the first end portion located within the ball valve. The first end portion and the second end portion are magnetized by the background magnetic field when the first solenoid and the second solenoid are not energized. Energizing the first solenoid at least partially demagnetizes the first end portion, causing the ferromagnetic ball to move to the magnetized second end portion, covering the opening of the loop tube and blocking the flow of the coolant. Energizing the second solenoid at least partially demagnetizes the second end portion, causing the ferromagnetic ball to move to the magnetized first end portion, covering another opening of the loop tube and enabling the flow of the coolant through the plurality of through-holes.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
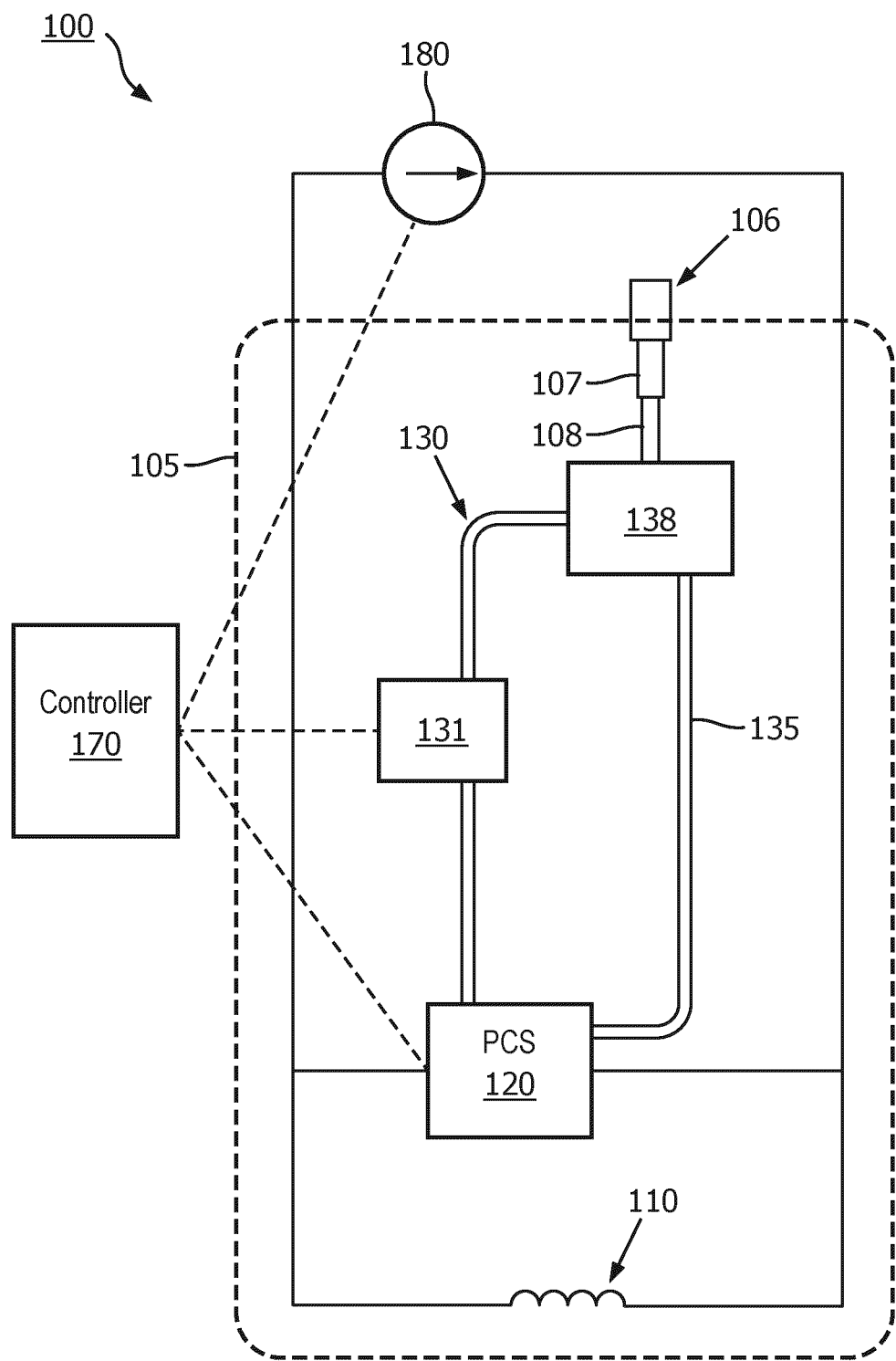
FIG. 1 is a simplified block diagram of a superconducting magnet system, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only, and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

A "computer-readable storage medium" encompasses any tangible storage medium which may store instructions which are executable by a "processor" of a "computing device." The computer-readable storage medium may be referred to as a non-transitory computer-readable storage medium, to distinguish from transitory media such as transitory propagating signals. The computer-readable storage medium may also be referred to as a tangible computer-readable medium.

In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

"Memory" is an example of a computer-readable storage medium. Computer memory is any memory which is directly accessible to a processor. Examples of computer memory include, but are not limited to RAM memory, registers, and register files. References to "computer memory" or "memory" should be interpreted as possibly being multiple memories. The memory may for instance be multiple memories within the same computer system. The memory may also be multiple memories distributed amongst multiple computer systems or computing devices. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to "computer storage" or "storage" should be interpreted as possibly including multiple storage devices or components. For instance, the storage may include multiple storage devices within the same computer system or computing device. The storage may also include multiple storages distributed amongst multiple computer systems or computing devices.

A "processor" as used herein encompasses an electronic component which is able to execute software, a program and/or machine executable instruction, e.g., stored in a memory and/or on a computer readable medium. References to a "computing device" comprising "a processor" should be interpreted as possibly containing more than one processor or processing core, as well as possibly containing one or more application specific integrated circuits (ASICs), field-programmable gate arrays (FPGAs), or combinations thereof. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have instructions performed by multiple processors that may be within the same computing device or which may even be distributed across multiple computing devices.

A "user interface" or "user input device" as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the user's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from a user.

A "hardware interface" encompasses an interface which enables the processor of a computer system or computer device to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Accordingly, the system for controlling temperature of a magnet persistent current switch (PCS) enables efficient cooling of the PCS, separate from a cooling system (e.g., cryostat) for superconducting coil(s). Generally, embodiments described herein are directed to a thermal switch that thermally disconnects the PCS from the cooling system to enable energization of the superconducting coils in a superconducting magnet, such as an MRI magnet, for example. Thermally disconnecting from the cooling system is needed to prevent heat coming from the PCS from overwhelming the cooling system, which also maintains the low temperature of the superconducting coils. The thermal switch may be used for a low-cryogen superconducting magnet, in particular, which has a relatively small helium volume for cooling the magnet through convective helium flow, as opposed to conductive cooling of a magnet in a conventional helium bath. As mentioned above, the thermal switch prevents excessive heat, generated by the PCS when energizing the magnet, from overloading the cryostat for cooling the superconducting coils of the magnet. The thermal switch further enables the PCS to maintain the same temperature as the superconducting coils when the magnet is in persistent current mode operation. Thus, the various embodiments provide a temperature control system that allows the temperature of the PCS to rise and fall as desired within seconds, without straining the cryostat for cooling the superconducting coils. In addition, energy required for operating the thermal switch is limited to only switching operations, which take place within a few milliseconds, thus further limiting the amount of heat input to the cryostat.

FIG. 1 is a simplified block diagram of a superconducting magnet system, in accordance with a representative embodiment.

Referring to FIG. 1, superconducting magnet system 100 includes a superconducting coil 110 of a superconducting magnet connected in parallel with a magnet PCS 120 and a power supply 180 (shown as a current source, for purposes of illustration). The superconducting coil 110 is in a cryostat 105 of the superconducting magnet system 100 in order to limit heat input to the superconducting coil 110. The superconducting coil 110 may be maintained at low temperature by a cryocooler 106 in (and attached to) the cryostat 105, where the cryocooler 106 has a first stage 107 that maintains the temperature of a thermal shield (not shown) that envelops the superconducting coil 110 at about 40 Kelvin, and a second stage 108, that maintains the temperature of the superconducting coil 110 at about 4 Kelvin. A portion of the cryocooler 106 is accessible from outside the cryostat 105. A heat exchanger 138 of a convective cooling loop 130 is permanently connected to, or in thermal contact with, the second stage 108 of the cryocooler 106. A power supply 180 may be permanently or temporarily connected to electrical contacts outside the cryostat 105.

A controller 170 may be implemented by a computer system or computer device, for example, with one or more processors executing instructions, e.g., stored in memory and/or on a computer readable medium, as discussed above. In the depicted embodiment, the controller 170 controls the power supply 180 and the state of the PCS 120, indicated by dashed lines, to enable ramping up the magnet, putting the magnet in persistent current mode, and ramping down the magnet, e.g., in response to instructions given by an operator. The controller 170 also controls operation of a thermal switch 131, indicated by a dashed line, in the convective cooling loop 130 to control the temperature of the PCS 120 by selectively blocking and enabling flow of coolant through a loop tube 135 in the convective cooling loop 130. It is understood that the controller 170 includes one or more processors, as well as other components of a computer system, as described above. The instructions, stored in in memory and/or on a computer readable medium, and executed by the processor(s) include instructions for opening and closing the PCS 120, opening and closing the thermal switch 131, and changing the voltage/power output by the power supply 180.

More particularly, the controller 170 controls the PCS 120 to selectively enter a closed state (superconducting state) and an open state (non-superconducting state). The PCS 120 includes composite superconducting wire made of superconducting filaments inside a copper matrix, similar to the superconducting wire used in the Superconducting coil 110. Like other superconducting wire, this composite superconducting wire acts as a "normal" conductor at high temperature and as "superconductor" at cryogenic temperature. When the PCS 120 is in a closed (superconducting) state, it is able to carry the main magnet current, and the superconducting magnet is able to enter the persistent current mode. The PCS 120 may be switched to the closed state by cooling, e.g., using the cryocooler 106. When the PCS 120 is in an open (non-superconducting or normal) state, it cannot carry the main magnet current. The PCS 120 may be switched to the closed state by heating, e.g., using a PCS heater (not shown). However, the PCS 120 has a small (normal) resistance in the open state, which is high enough that, when the magnet is connected to the power supply 180, only a small amount of current flows through the PCS 120 and the rest of the current flows in the superconducting coil 110.

Accordingly, when the PCS 120 is open, the magnet may be in a ramping state, during which the PCS 120 dissipates power because the ramping voltage across the PCS 120 generates current flowing through its normal resistivity. When the PCS 120 is closing, there is no ramping voltage present and no power dissipation. The PCS 120 transitions from the open state to the closed state by means of cooling, via the convective cooling loop 130 discussed below, and the power supply 180 maintains magnet operating current during the transition. When the PCS 120 is in the fully closed state (as opposed to transitioning between open and closed), the power supply 180 ramps down the current. The high self inductance of the superconducting coil 110 ensures that the coil current does not change, so as a result (e.g., from Kirchhoff Current Law), current through the PCS 120 ramps up as the power supply 180 current ramps down.

In addition, the controller 170 controls the thermal switch 131 in the convective cooling loop 130 to open and close depending on the action required by the operator. For example, when the PCS 120 is in the open state while the magnet needs to be put into persistent current mode after a ramping activity, the thermal switch 131 is opened to enable the flow of coolant through the convective cooling loop 130, thereby thermally connecting the PCS 120 to heat exchanger 138 via the loop tube 135 to provide additional cooling for closing the PCS 120. When the PCS 120 is in the closed state, but needs to be opened, for instance to ramp the magnet up or down, the thermal switch 131 is closed to stop the flow of coolant through the convective cooling loop 130, e.g., by blocking the loop tube 138 as discussed below, thereby thermally disconnecting the PCS 120 from heat exchanger 138, and allowing it to heat up to open without overloading the second stage 108 of the cryocooler 106. When the magnet is in the ramping state, and the PCS 120 is in the open state, the thermal switch 131 is in closed state to ensure that power generated by the PCS 120 does not overload the second stage 108 of the cryocooler 106 (which keeps the superconducting coil 110 cold). When the magnet enters the persistent current state, the thermal switch 131 is opened to keep the PCS 120 thermally connected to the heat exchanger 138, ensuring that the PCS 120 stays in superconducting state.

In an embodiment, the controller 170 may send out pulses to electromagnets (e.g., solenoids) in the thermal switch 131 in order to move a ferromagnetic ball in the thermal switch 131 into flow-blocking position, as discussed below, closing the thermal switch 131. The controller 170 system then powers an electrical heater (not shown) to warm up the PCS 120 to drive the PCS 120 out of superconductive (closed) state and into resistive (open) state. The PCS 120 in the closed state enables the power supply 180 to generate current that passes through the superconducting coil 110, while keeping the superconducting magnet cold, as discussed above. Similarly, the controller 170 may send out pulses to electromagnets in the thermal switch 131 in order to move the ferromagnetic ball in the thermal switch 131 out of the flow-blocking position, opening the thermal switch 131 and providing additional cooling to the PCS 120.

The second stage 108 of the cryocooler 106 is able to bring the superconducting coil 110 of the magnet system to the desired cryogenic temperature of about 4 Kelvin, although it has a limited capacity for absorbing power. Thus, heat coming from the PCS 120 in the open state would otherwise overload the cryocooler 106. As discussed above, when the power supply 180 is connected across the PCS 120 in its open state, most of the current will flow into the superconducting coil 110, and only a small current will flow through the normal, resistive wires of the PCS 120. Once current flowing through the superconducting coil 110 has reached its target value (target current), the controller 170 controls the PCS 120 to enter the closed state, enabling the superconducting coil 110 to operate in a persistent current mode with effectively zero resistance, after ramping down the power supply 180. This may be referred to as a closed superconducting circuit. The target current is the current needed to flow in the wire to make the target field at the center of the superconducting magnet.

In general, the magnet PCS 120 generates heat (thermal energy) when in the open state due to current flow through the normal resistance, and also may continue to generate heat when controlled to transition from the closed state to the open state or vice versa. When the current in the superconducting coil 110 has reached the target current, the controller 170 turns off the voltage of the power supply 180, but the high inductance of the superconducting coil 110 causes the current to continue to flow through the power supply 180. In this condition, there is no power dissipation in the PCS 120 anymore, and the PCS 120 is ready to be cooled down to switch from the open state to the closed state. Cooling the PCS 120 is done, in part, by controlling the thermal switch 131 to allow the coolant to flow in the loop tube 135 of the convective cooling loop 130, and thus to thermally connect the PCS 120 to the second stage 108 of the cryocooler 106.

The loop tube 135 may be formed of a non-magnetic metal, such as copper, aluminum, titanium, zinc, tin or lead, for example, or other non-magnetic material. The loop tube 135 is hermetically sealed, and the coolant contained in the loop tube 135 may be helium gas or helium liquid, for example, for enabling the convective transfer of thermal energy between the PCS 120 and the heat exchanger 138. Other types of gas and/or liquid coolant may be incorporated without departing form the scope of the present teachings.

The thermal switch 131 is configured to open and close the loop tube 135 in order to selectively enable and block flow of the coolant, respectively. When the thermal switch 131 is open, the coolant can flow through the loop tube 135 between the PCS 120 and the heat exchanger 138 in order to dissipate the heat being generated. When the thermal switch 131 is closed, the flow of the coolant through the loop tube 135 is blocked. In various embodiments, the thermal switch 131 may be implemented using a ball valve (not shown in FIG. 1) containing a ferromagnetic ball having a diameter greater than an inner diameter of an opening of the loop tube 135, and/or of an orifice adjoining the opening of the loop tube 135, and electromagnets configured to control placement of the ferromagnetic ball within the opening of the loop tube 135 or the orifice within the ball valve to selectively block the loop tube 135 by activating and deactivating magnetic fields, as discussed below. That is, the electromagnets are configured to control placement of the ferromagnetic ball in the opening of the loop tube 135 or the orifice within the ball valve to block the loop tube 135, and to remove the ferromagnetic ball from the opening of the loop tube 135 or the orifice to open up the loop tube 135.

Figure 5:
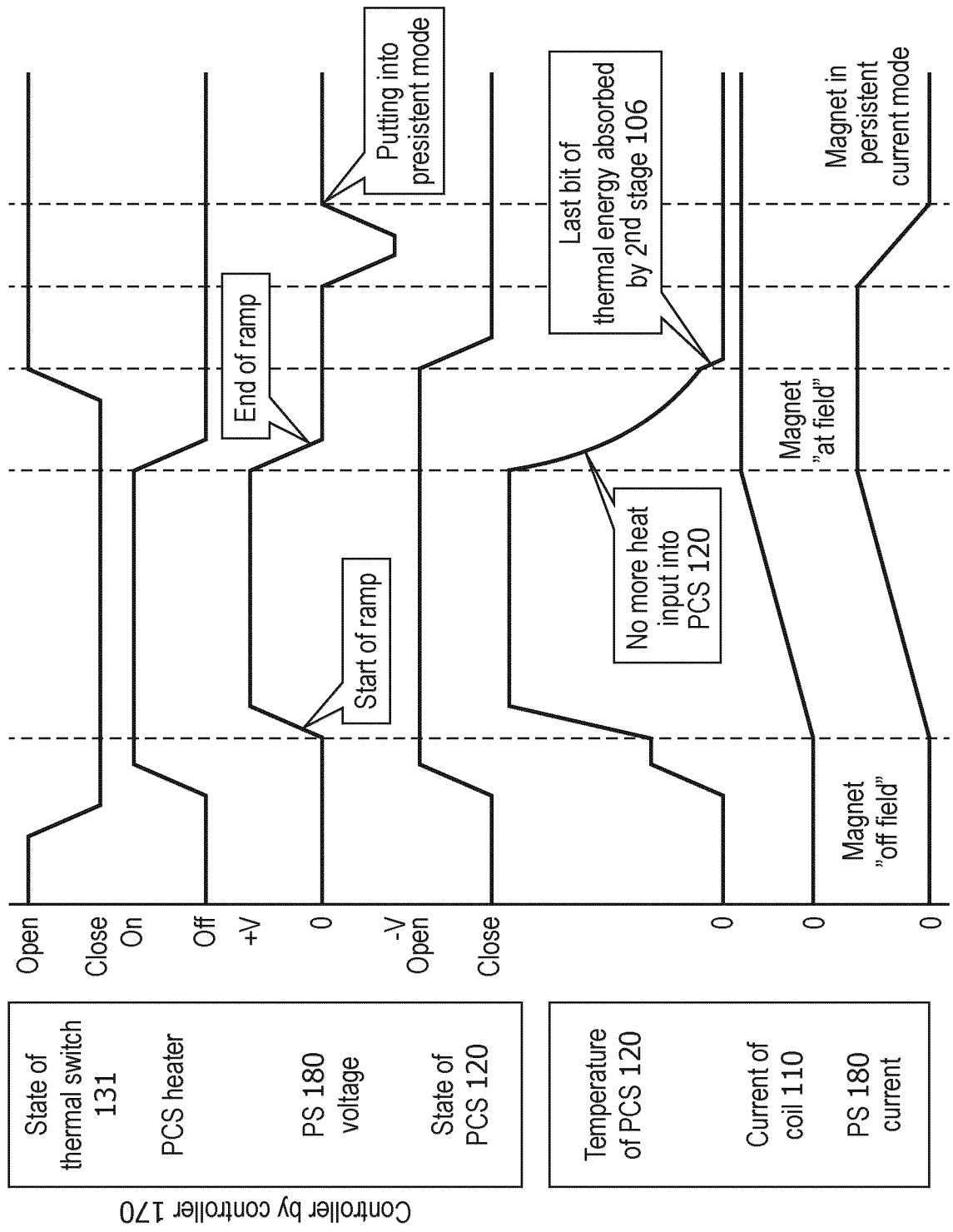
FIG. 5 is a simplified state flow diagram for operation of a superconducting magnet system, in accordance with a representative embodiment.

FIG. 5 is a simplified state flow diagram for operation of the superconducting magnet system 100, in accordance with a representative embodiment. More particularly, the state flow diagram shows states of the thermal switch 131, a PCS heater for the PCS 120, and the PCS 120, as well as voltage levels of the power supply 180, during a ramping up operation, for purposes of illustrating operation of the thermal switch 131 in the context of operating the PCS 120. That is, FIG. 5 shows a ramping up process for ramping current in the superconducting coil 110 to target current, and ultimately placing the magnet in persistent current mode. The timeline (horizontal axis) is arbitrary. As would be apparent to one skilled in the art, the ramping down process is similar, but would be the reverse of the ramping up process. Ramping up the superconducting coil 110 to put the magnet into persistent current mode takes much longer than ramping down the power supply 180. The process may be controlled, for example, by the controller 170.

Referring to the top portion (top four traces) of FIG. 5, the thermal switch 131 is controlled to transition from the open state to the closed state, blocking flow of coolant through the loop tube 135 in the convective cooling loop 130 to prevent heat form the PCS 120 from overloading the second stage 108 of the cryocooler 106. The PCS heater is controller to turn on to warm the PCS 120, which transitions from the closed state to the open state in response. The power supply 180 is controlled to transition from 0 to positive voltage to begin the ramping process. The ramping process ends when the power supply 180 is controlled to transition from the positive voltage back to 0, at which time the PCS heater is also turned off. The thermal switch 131 is then controlled to transition from the closed state to the open state, enabling the flow of coolant through the loop tube 135, to provide additional or supplemental cooling for the PCS 120. The PCS 120 cools down, and enters the closed state, and the power supply 180 is subsequently controlled to transition from 0 to negative voltage temporarily to cause the magnet to enter the persistent current mode.

Referring to the bottom portion (bottom three traces) of FIG. 5, the temperature of the PCS 120 begins to increase when the PCS heater is turned on and the PCS 120 transitions to the open state, and further increases when the power supply 180 transitions from 0 to positive voltage at the start of the ramping up process. The thermal switch 131 is in the closed state during substantially the entire time the PCS 120 is at a heightened temperature, to prevent heat from overloading the second stage 108 of the cryocooler 106. Meanwhile, the current through the superconducting coil 110 begins to increase at the beginning of the ramping up process, and reaches the target current at the end of the ramping process, which current is maintained. The superconducting magnet is considered "off field" prior to the ramping up process, and "at field" once the current reaches target. The magnet is in the persistent current mode after the power supply 180 is discharged, and the target current is carried entirely by the coil 110 and the PCS 120.

Figure 2A:
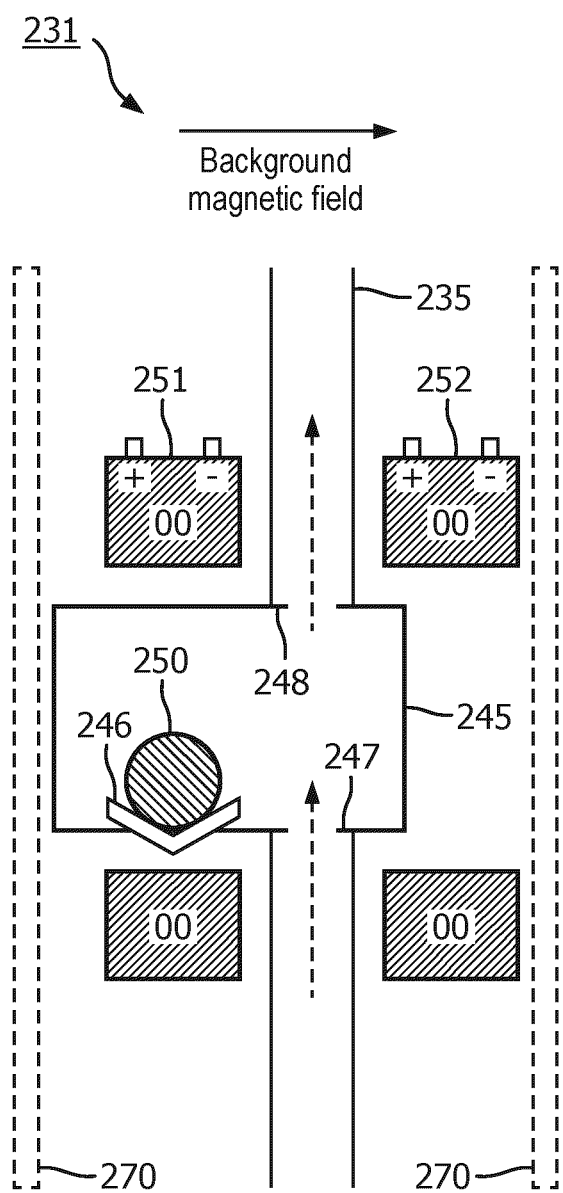
FIG. 2A is a simplified cross sectional view of a thermal switch in a cooling loop of a superconducting magnet system in an open position, in accordance with a representative embodiment.
Figure 2B:
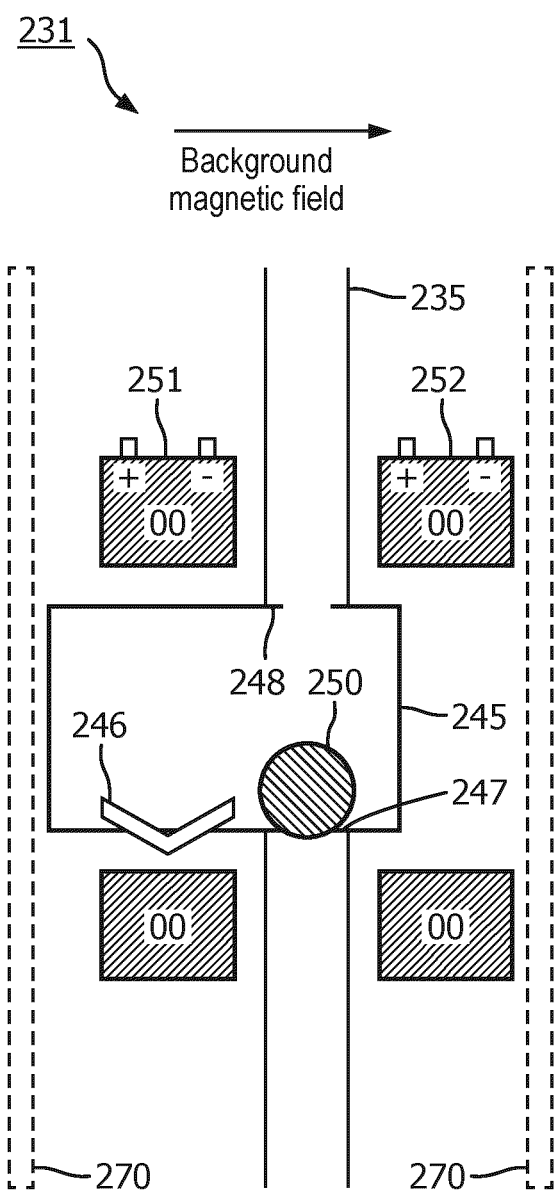
FIG. 2B is a simplified cross sectional view of a thermal switch in a cooling loop of a superconducting magnet system in a closed position, in accordance with a representative embodiment.

FIGS. 2A and 2B are simplified cross sectional views of a thermal switch in a convective cooling loop of a superconducting magnet system in open and closed positions, in accordance with a representative embodiment. The thermal switch depicted in FIGS. 2A and 2B, and discussed below, may be used as the thermal switch 131 in FIG. 1.

Referring to FIGS. 2A and 2B, a thermal switch 231 is positioned in a loop tube 235, which is substantially the same as the loop tube 135 described above. The thermal switch 231 includes a ball valve 245 containing a ferromagnetic ball 250, and two electromagnets indicated by a first solenoid 251 and a second solenoid 252 positioned outside the loop tube 235 adjacent the ball valve 245. Although the thermal switch 231 is described as including first and second solenoids 251 and 252, it is understood that other types of electromagnets may be incorporated without departing form the scope of the present teachings. The first and second solenoids 251 and 252 are on opposite sides of the loop tube 235 in order to control movement of the ferromagnetic ball 250 within the ball valve 245 by selectively energizing and de-energizing the first and second solenoids 251 and 252, as discussed below. The loop tube 235 is formed of a non-magnetic metal, such as copper, aluminum, titanium, zinc, tin or lead, for example, or other non-magnetic material. The ferromagnetic ball 250 is formed of any compatible ferromagnetic material, such as iron, nickel or cobalt, for example.

In the depicted embodiment, the first and second solenoids 251 and 252 wrap around the ball valve 245, so that in the cross sectional views, portions of each of the first and second solenoids 251 and 252 appear above and below the ball valve 245. The thermal switch 231 is located in an area of the superconducting magnet system where the background magnetic field from the superconducting magnet itself, as well as its spatial gradient, is small enough for the first and second solenoids 251 and 252, when energized, to overcome any magnetic force on the ferromagnetic ball 250. In the depicted example, the direction of the background magnetic field is left to right, as indicated by an arrow.

The ball valve 245 is integrated with the loop tube 235, such that the loop tube 235 effectively passes through the ball valve 245 via first (upstream) orifice 247 and second (downstream) orifice 248 defined by the ball valve 245. The ferromagnetic ball 250 has a diameter greater than an inner diameter of the first orifice 247 (and of the loop tube 235). The first orifice 247 and the second orifice 248 may coincide with openings of the loop tube 235 itself, such that each of the first orifice 247 and the second orifice 248 adjoins a corresponding opening of the loop tube 235. The ball valve 245 provides bi-stable operation in that the ferromagnetic ball 250 is located in one of two possible positions: a first (open) position shown in FIG. 2A where the ferromagnetic ball 250 is in a notch 246, and a second (closed) position shown in FIG. 2B where the ferromagnetic ball 250 is in the first orifice 247. When the ferromagnetic ball 250 is in the first position, the thermal switch 231 is open and the coolant is able to flow through the loop tube 235, indicated by dashed arrows in FIG. 2A. When the ferromagnetic ball 250 is in the second position, the thermal switch 231 is closed and the coolant is not able to flow through the loop tube 235 (due to the ferromagnetic ball 250 blocking the first orifice 247, and thus the loop tube 235). In alternative configurations, the coolant flow may be in the opposite direction, without departing from the scope of the present teachings.

The first and second solenoids 251 and 252 are selectively energized and de-energized under control of a controller, such as the controller 170 in FIG. 1, as discussed above, in order to move the ferromagnetic ball 250 between the notch 246 and the first orifice 247. Energizing the first solenoid 251 or the second solenoid 252 may include pulsing the first solenoid 251 or the second solenoid 252 with a voltage from a voltage source (not shown) for a short period of time (e.g., about 1 to about 100 milliseconds). As shown FIG. 2A, when the first solenoid 251 is energized (e.g., pulsed), it generates a magnetic field in a direction that magnetically attracts the ferromagnetic ball 250 to the first solenoid 251, moving the ferromagnetic ball 250 to the first position in the notch 246. When the first solenoid 251 is de-energized after a short period of time, the ferromagnetic ball 250 is held in the notch 246 by the force of gravity. As shown FIG. 2B, when the second solenoid 252 is energized (e.g., pulsed), it generates a magnetic field in a direction that magnetically attracts the ferromagnetic ball 250 to the second solenoid 252, moving the ferromagnetic ball 250 to the second position in the first orifice 247. When the second solenoid 252 is de-energized after a short period of time, the ferromagnetic ball 250 is held in the first orifice 247 by the force of gravity.

The strength of the magnetic force on the ferromagnetic ball 250 is a function of the volume of the ferromagnetic ball 250 and the gradient of the magnetic field strength in the ferromagnetic ball 250. That is, each of the first solenoid 251 and the second solenoid 252 is configured to create a magnetic force strong enough overcome the gravitational force and force resulting from the background magnetic field acting on and in the ferromagnetic ball 250, in order to magnetically move the ferromagnetic ball 250 within the ball valve 245.

Depending on the position of the thermal switch 231 and/or the convective cooling loop within the superconducting magnet system, the background magnetic field may disable or impair the functionality of the thermal switch 231. In this case, an optional magnetic shield 270 formed of a ferromagnetic material, such as iron, nickel or cobalt, for example, may be incorporated to divert field lines from the background magnetic field around the thermal switch 231 configuration. Inclusion of the magnetic shield 270 enlarges the space needed to install the thermal switch 231 inside the cryostat (e.g., cryostat 105).

Figure 3A:
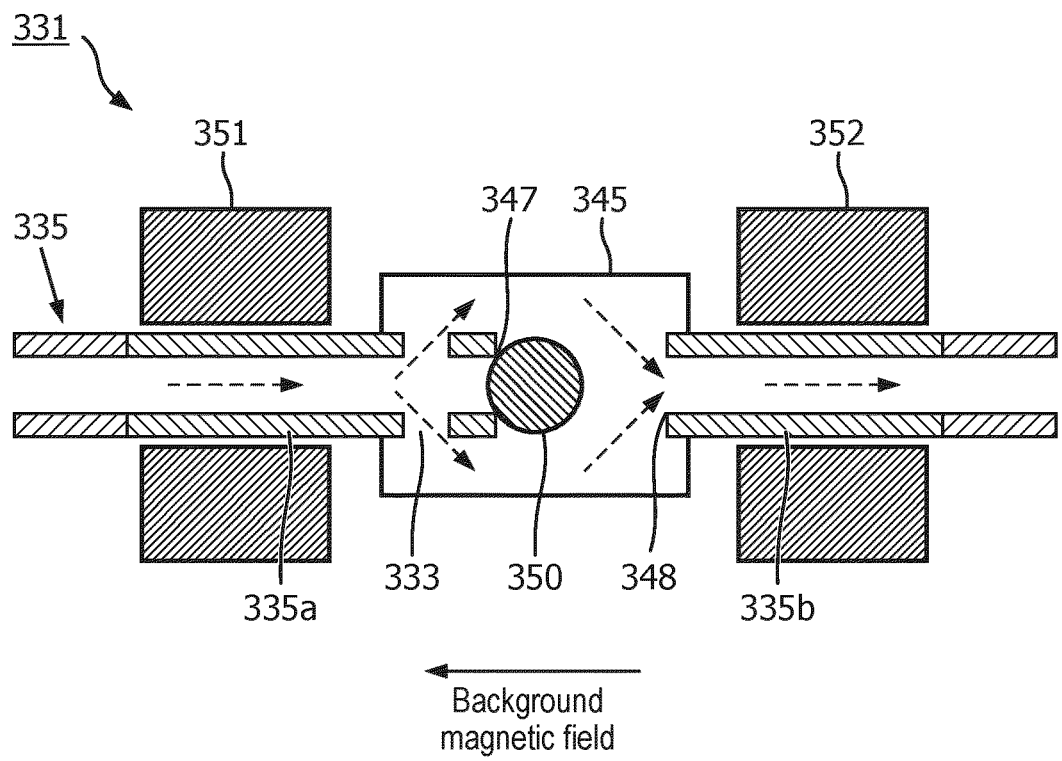
FIG. 3A is a simplified cross sectional view a thermal switch in a cooling loop of a superconducting magnet system in an open position, in accordance with another representative embodiment.
Figure 3B:
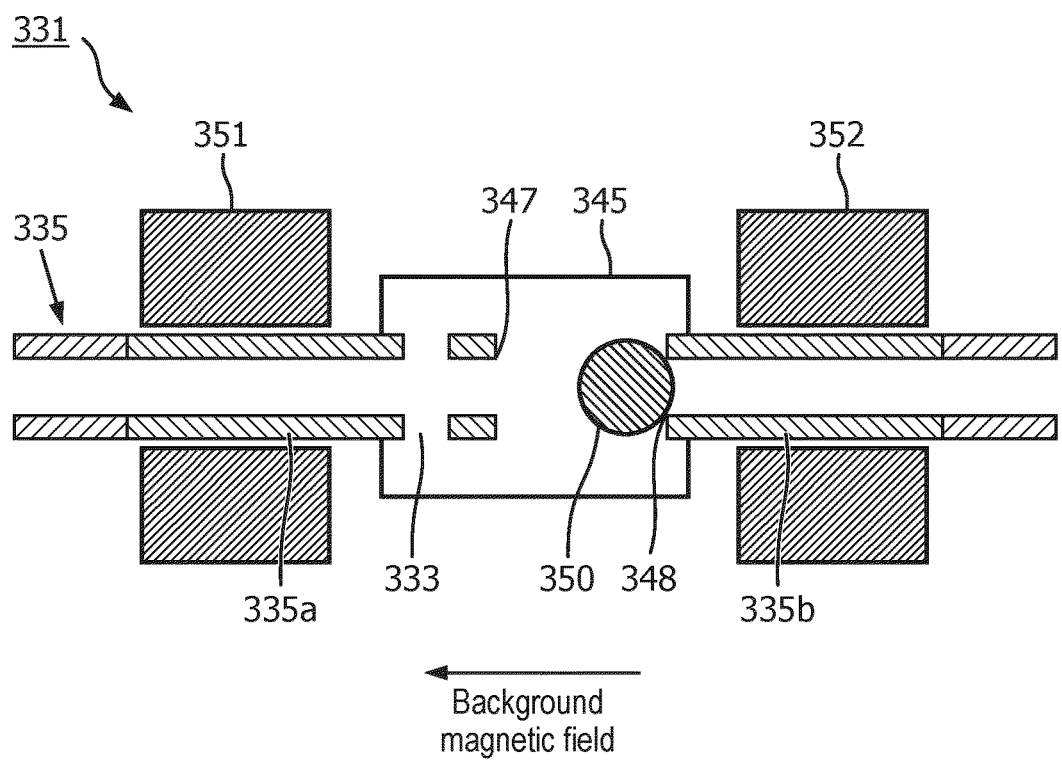
FIG. 3B is a simplified cross sectional view of a thermal switch in a cooling loop of a superconducting magnet system in a closed position, in accordance with another representative embodiment.

FIGS. 3A and 3B are simplified cross sectional views of a thermal switch in a convective cooling loop of a superconducting magnet system in open and closed positions, in accordance with a another representative embodiment. The thermal switch depicted in FIGS. 3A and 3B, and discussed below, may be used as the thermal switch 131 in FIG. 1.

Referring to FIGS. 3A and 3B, a thermal switch 331 is positioned in a convective loop tube 335, which is substantially the same as the loop tube 135 described above. The thermal switch 331 includes a ball valve 345 containing a ferromagnetic ball 350, and two electromagnets indicated by a first solenoid 351 and a second solenoid 352 positioned outside the loop tube 335 adjacent the ball valve 345. Other types of electromagnets may be incorporated without departing from the scope of the present teachings. The ferromagnetic ball 350 is formed of any compatible ferromagnetic material, such as iron, nickel or cobalt, for example. The first and second solenoids 351 and 232 are on opposite sides of the ball valve 345 in order to control movement of the ferromagnetic ball 350 within the ball valve 345 by selectively energizing and de-energizing the first and second solenoids 351 and 352, as discussed below. In the depicted embodiment, the first and second solenoids 351 and 352 wrap around the loop tube 335, so that in the cross sectional views, portions of each of the first and second solenoids 351 and 352 appear above and below the loop tube 335.

In the depicted embodiment, the loop tube 335 includes an first (upstream) end portion 335a, which is formed of ferromagnetic material, such as iron, nickel or cobalt, for example, and partially extends into a first side of the ball valve 345. The loop tube 335 further includes a second (downstream) end portion 335b, which is also formed of ferromagnetic material and partially extends into a second side of the ball valve 345. The remainder of the loop tube 335 is formed of a non-magnetic metal, such as copper, aluminum, titanium, zinc, tin or lead, for example, or other non-magnetic material, as discussed above with reference to the loop tube 135. A first opening 347 of the loop tube 335 is defined by the first end portion 335a and a second opening 348 of the loop tube 335 is defined by the second end portion 335b in the ball valve 345. The first end portion 335a also defines one or more through-holes 333 located within the ball valve 345. The through-holes 333 enable the flow of coolant into the ball valve 345, indicated by dashed arrows in FIG. 3A, even when the ferromagnetic ball 350 is blocking the first opening 347, as discussed below.

The thermal switch 331 is located in an area of the superconducting magnet system where the background magnetic field from the superconducting magnet itself, as well as its spatial gradient, is large enough that the field lines of the background magnetic field will be attracted by the first end portion 335a and the second end portion 335b of the loop tube 335. In response, the first end portion 335a and the second end portion 335b will create field gradients at the first opening 347 and the second opening 348, respectively, when the first and second solenoids 351 and 352 are not energized. This causes the ferromagnetic ball 350 to be magnetically attracted to the first end portion 335a and the second end portion 335b when the first and second solenoids 351 and 352 are not energized. Even a low background magnetic field can create sufficient magnetic force on the ferromagnetic ball 350 to hold it in place at one of the first and second openings 347 and 348. In the depicted example, the direction of the background magnetic field is right to left, as indicated by an arrow.

The ball valve 345 is integrated with the loop tube 335, such that the loop tube 335 effectively passes through the ball valve 345. The ferromagnetic ball 350 has a diameter greater than an inner diameter of the first and second openings 347 and 348 of the loop tube 335. The ball valve 345 provides bi-stable operation in that the ferromagnetic ball 350 is located in one of two possible positions: a first (open) position shown in FIG. 3A where the ferromagnetic ball 350 is magnetically drawn to the first end portion 335a with sufficient force to block the first opening 347, and a second (closed) position shown in FIG. 3B where the ferromagnetic ball 350 is magnetically drawn to the second end portion 335b with sufficient force to block the second opening 348. When the ferromagnetic ball 350 is in the first position, the thermal switch 331 is open and the coolant is able to flow through the loop tube 335 via the through-hole(s) 333, indicated by the dashed arrows in FIG. 3A. When the ferromagnetic ball 350 is in the second position, the thermal switch 331 is closed and the coolant is not able to flow through the loop tube 335 (due to the ferromagnetic ball 350 blocking the first opening 347).

The first and second solenoids 351 and 352 are selectively energized and de-energized under control of a controller, such as the controller 170 in FIG. 1, as discussed above, in order to move the ferromagnetic ball 350 between the first opening 347 and the second opening 348. Energizing the first solenoid 351 or the second solenoid 352 may include pulsing the first solenoid 351 or the second solenoid 352 with a voltage from a voltage source (not shown) for a short period of time (e.g., about 1 to about 100 milliseconds). When one of the first solenoid 351 and the second solenoid 352 is energized, it generates a corresponding magnetic field having a direction opposite to that of the background magnetic field, thereby partially or completely demagnetizing the first end portion 335a or the second end portion 335b of the loop tube 335, respectively. As a result, the ferromagnetic ball 350 is magnetically pulled toward the other one of the first solenoid 351 (and the first end portion 335a) or the second solenoid 352 (and the second end portion 335b) that has not been energized since the corresponding first end portion 335a or the second end portion 335b continues to be magnetized by the background magnetic field.

More particularly, as shown FIG. 3A, when the second solenoid 352 is energized (e.g., pulsed), the second end portion 335b is demagnetized and the ferromagnetic ball 350 is therefore magnetically attracted to the first end portion 335a, which remains magnetized by the background magnetic field while the second solenoid 352 is pulsed. Accordingly the ferromagnetic ball 350 moves to the first position, blocking the first opening 347 of the magnetized first end portion 335a, while the second opening 348 is unobstructed. The thermal switch 331 is thus open and the coolant is able to flow through the loop tube 335, indicated by dashed arrows in FIG. 3A. When the second solenoid 352 is de-energized after a short period of time (e.g., as soon as the ferromagnetic ball 350 has moved to the first position), the ferromagnetic ball 350 is held in the first position by the magnetized first end portion 335a, even though the second end portion 335b magnetizes again. If the background magnetic field is not strong enough to hold the ferromagnetic ball 350, such as at the start of energization of the superconducting magnet, a small amount of reverse voltage may be supplied to energize the first solenoid 351 to generate a magnetic field in a direction that increases magnetic attraction, and/or a small amount of (forward) voltage may be applied to energize the second solenoid 352 to generate a magnetic field in a direction that again partially demagnetizes the second end portion 335b and reduces the opposing magnetic force, in order to keep the ferromagnetic ball 350 in the first position.

Similarly, as shown FIG. 3B, when the first solenoid 351 is energized (e.g., pulsed), the first end portion 335a is demagnetized and the ferromagnetic ball 350 is therefore magnetically attracted to the second end portion 335b, which remains magnetized by the background magnetic field. Accordingly the ferromagnetic ball 350 moves to the second position, blocking the second opening 348 of the magnetized second end portion 335b, while the first opening 347 is unobstructed. The thermal switch 331 is thus closed and the coolant is unable to flow through the loop tube 335. When the first solenoid 351 is de-energized after a short period of time (e.g., as soon as the ferromagnetic ball 350 has moved to the second position), the ferromagnetic ball 350 is held in the second position by the magnetized second end portion 335b, even though the first end portion 335a magnetizes again. If the background magnetic field is not strong enough to hold the ferromagnetic ball 350, a small amount of reverse voltage may be supplied to energize the second solenoid 352 to generate a magnetic field in a direction that increases magnetic attraction, and/or a small amount of (forward) voltage may be supplied to energize the first solenoid 351 to generate a magnetic field in a direction that again partially demagnetizes the first end portion 335a and reduces the opposing magnetic force, in order to keep the ferromagnetic ball 350 in the second position.

Figure 4:
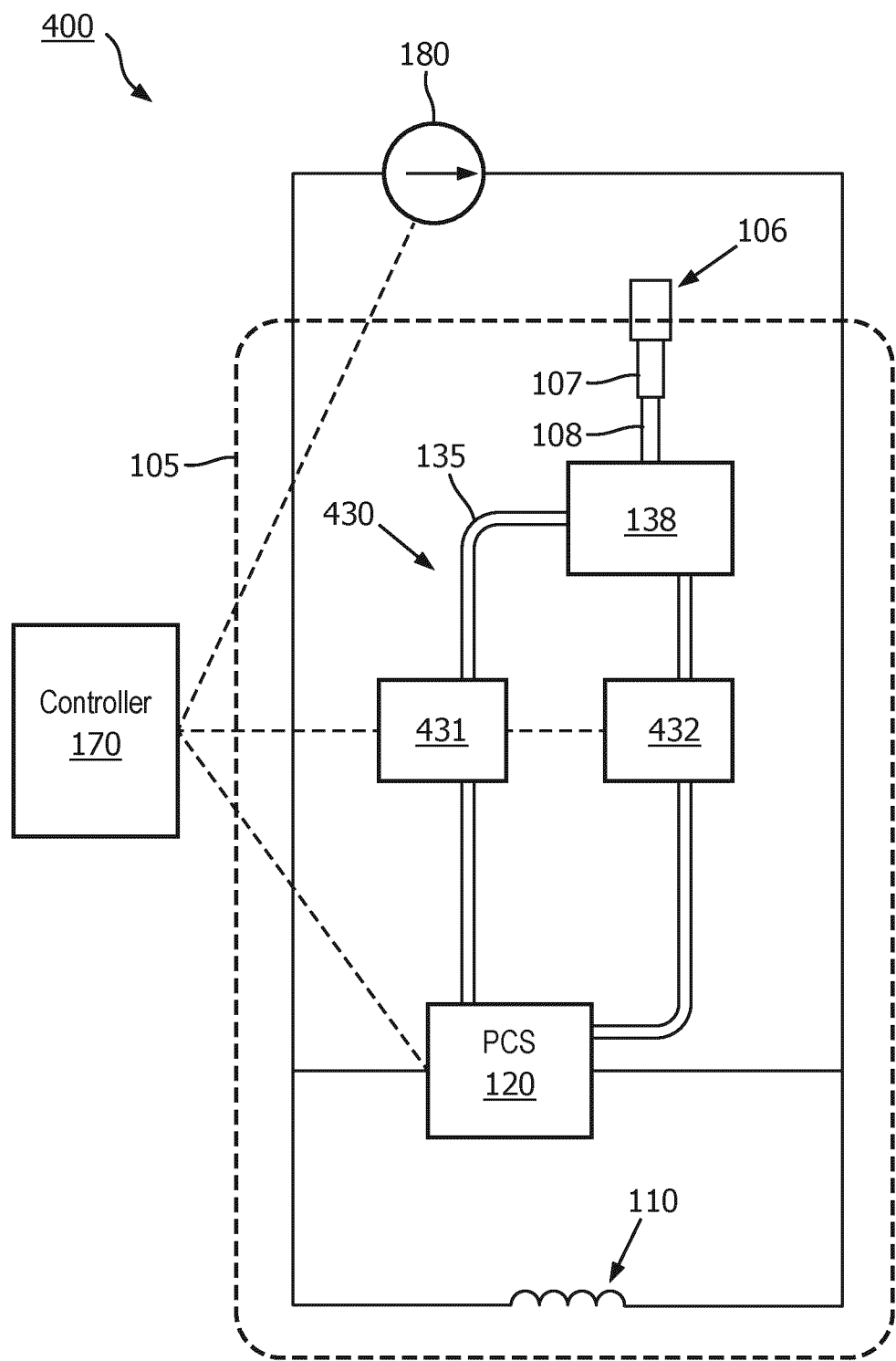
FIG. 4 is a simplified block diagram of a superconducting magnet system, in accordance with another representative embodiment.

In alternative embodiments, the cooling loop for separately controlling temperature of the PCS in a superconducting magnet system may include multiple thermal switches, such as the thermal switch 231 and/or the thermal switch 331 discussed above. FIG. 4 is a simplified block diagram of a superconducting magnet system, in accordance with another representative embodiment, that includes multiple thermal switches.

Referring to FIG. 4, superconducting magnet system 400 includes superconducting coil 110 connected in parallel with magnet PCS 120 and power supply 180, as discussed above with reference to FIG. 1. Heat generated by the PCS 120 is dissipated primarily by a convective cooling loop 430 for separately controlling temperature of the PCS 120. The convective cooling loop 430 includes a heat exchanger 138 and a loop tube 135, as well as a first thermal switch 431 and a second thermal switch 432 integrated with the loop tube 135 between the PCS 120 and the heat exchanger 138. In the depicted example, the first thermal switch 431 (like the thermal switch 131 in FIG. 1) is positioned on a supply portion of the loop tube 135 conveying coolant from the PCS 120 to the heat exchanger 138, and the second thermal switch 432 is positioned on a return portion of the loop tube 135 conveying coolant from the heat exchanger 138 to the PCS 120. The loop tube 135 is hermetically sealed, and the coolant contained in the loop tube 135 may be helium gas or helium liquid, for example, for enabling the convective transfer of thermal energy between the PCS 120 and the heat exchanger 138.

The first and second thermal switches 431 and 432 are configured to open and close the loop tube 135 under control of the controller 170 in order to selectively enable and block flow of the coolant, respectively. For example, the first and second thermal switches 431 and 432 are closed to allow the PCS 120 to generate heat without thermally overloading the second stage 108 of the cryocooler 106, for example, when the PCS 120 is in the open state and/or when the PCS 120 is being transitioned from the closed state to the open state or vice versa. Otherwise, the first and second thermal switches 431 and 432 are opened, for example, when the PCS 120 is in the closed state, enabling the flow of the coolant through the loop tube 135 to keep the PCS 120 cold. Examples of this condition are the very beginning and the very end of the traces in FIG. 5.

In various embodiments, each of the first and second thermal switches 431 and 432 may be implemented using a ball valve, as described above with respect to the thermal switches 231 and 331 in FIGS. 2 and 3, respectively. Description of the structure and operation of the individual first and second thermal switches 431 and 432 therefore will not be repeated here. In an embodiment, the first and second thermal switches 431 and 432 are operated substantially simultaneously, which increases efficiency of the convective cooling loop 430, because substantially simultaneous operation eliminates possibility of convective flow between the PCS 120 and the heat exchanger 138 inside only one of the two legs of the cooling loop 430. It also improves reliability of the system where two thermal switches are redundant, which avoids possible expensive and time consuming repair if one of the first and second thermal switches 431 and 432 fails.

Although the system for controlling temperature of a persistent current switch has been described with reference to several exemplary embodiments, it is understood that the words that have been used are words of description and illustration, rather than words of limitation. Changes may be made within the purview of the appended claims, as presently stated and as amended, without departing from the scope and spirit of the system for controlling temperature of a persistent current switch in its aspects. Although the system for controlling temperature of a persistent current switch has been described with reference to particular means, materials and embodiments, the system for controlling temperature of a persistent current switch is not intended to be limited to the particulars disclosed; rather the system for controlling temperature of a persistent current switch extends to all functionally equivalent structures, methods, and uses such as are within the scope of the appended claims.

Although the present specification describes components and functions that may be implemented in particular embodiments with reference to particular standards and protocols, the disclosure is not limited to such standards and protocols. Such standards are periodically superseded by more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A system for controlling temperature of a persistent current switch operating in a background magnetic field, the system comprising:

a heat exchanger configured to disperse heat to a cryocooler;
a loop tube configured to enable flow of coolant to convectively transfer thermal energy generated by the persistent current switch to the heat exchanger; and
a thermal switch comprising:
   a ball valve integrated with the loop tube between the persistent current switch and the heat exchanger, the ball valve containing a ferromagnetic ball having a diameter greater than an inner diameter of an opening of the loop tube or of an orifice in the ball valve adjoining the opening of the loop tube; and
   a plurality of electromagnets positioned outside the loop tube adjacent to the ball valve, wherein energizing a first electromagnet of the plurality of electromagnets magnetically moves the ferromagnetic ball to a first position opening the loop tube and enabling the flow of the coolant, and energizing a second electromagnet of the plurality of electromagnets magnetically moves the ferromagnetic ball to a second position closing the loop tube and blocking the flow of the coolant.

2. The system of claim 1, wherein the ball valve defines the orifice, and further contains a notch adjacent to the orifice, and
wherein energizing the first electromagnet magnetically moves the ferromagnetic ball to the notch, enabling the flow of the coolant, and energizing the second electromagnet magnetically moves the ferromagnetic ball to the orifice, blocking the flow of the coolant, the ferromagnetic ball being held in one of the notch and the orifice by gravitational force when the first electromagnet and the second electromagnet are de-energized.

3. The system of claim 2, wherein each of the first electromagnet and the second electromagnet is configured to create a magnetic force strong enough to overcome the gravitational force and force resulting from the background magnetic field acting on the ferromagnetic ball.

4. The system of claim 1, wherein the loop tube comprises a first end portion formed of a ferromagnetic material and partially extends into a first side of the ball valve, and a second end portion formed of the ferromagnetic material and partially extends into a second side of the ball valve, the first end portion defining one or more through-holes located within the ball valve,
wherein the first end portion and the second end portion are magnetized by the background magnetic field when the first electromagnet and the second electromagnet are not energized,
wherein energizing the first electromagnet at least partially demagnetizes the first end portion, causing the ferromagnetic ball to move to the magnetized second end portion, covering the opening of the loop tube and blocking the flow of the coolant, and
wherein energizing the second electromagnet at least partially demagnetizes the second end portion, causing the ferromagnetic ball to move to the magnetized first end portion, covering another opening of the loop tube and enabling the flow of the coolant through the one or more through-holes.

5. The system of claim 4, wherein each of the first end portion and the second end portion has substantially the same orientation as the background magnetic field.

6. The system of claim 4, wherein when the first electromagnet is energized to at least partially demagnetize the first end portion, the second electromagnet is energized with a reverse voltage, relative to a voltage used for energizing the first electromagnet, further causing the ferromagnetic ball to move to the magnetized second end portion.

7. The system of claim 6, wherein when the second electromagnet is energized to at least partially demagnetize the second end portion, the first electromagnet is energized with a reverse voltage, relative to a voltage used for energizing the first electromagnet, further causing the ferromagnetic ball to move to the magnetized first end portion.

8. The system of claim 1, wherein energizing the first electromagnet or the second electromagnet comprises pulsing the first electromagnet or the second electromagnet with a voltage.

9. The system of claim 1, wherein the gas or liquid coolant comprises helium gas or liquid.

10. The system of claim 1, wherein the persistent current switch enables energization of a superconducting magnet.

11. The system of claim 1, wherein the loop tube comprises a non-magnetic metal.

12. The system of claim 1, wherein the heat exchanger disperses heat to a cryocooler.

13. A system for controlling transfer of thermal energy of a persistent current switch to a heat exchanger in thermal contact with a cryocooler, the system comprising:
   a loop tube positioned between the persistent current switch and the heat exchanger, wherein coolant selectively flows through the loop tube;
   a first ball valve on a first part of the loop tube between the persistent current switch and the heat exchanger, the first ball valve containing a first ferromagnetic ball, a first orifice adjoining a first opening of a first part of the loop tube, and a first notch adjacent to the first orifice;
   a second ball valve on a second part of the loop tube between the persistent current switch and the heat exchanger, the second ball valve containing a second ferromagnetic ball, a second orifice adjoining a second opening of a second part of the loop tube, and a second notch adjacent to the second orifice;
   a first solenoid and a second solenoid positioned outside the first part of the loop tube adjacent to the first ball valve; and
   a third solenoid and a fourth solenoid positioned outside the second part of the loop tube adjacent to the second ball valve,
   wherein the coolant is able to flow through the loop tube by energizing the first and third solenoids such that the first and second ferromagnetic balls move to the first and second notches, respectively, opening the first and second parts of the loop tube, and
   wherein the coolant is blocked from flowing through the loop tube by energizing the second and fourth solenoids such that the first and second ferromagnetic balls move to the first and second orifices, respectively, closing off the first and second parts of the loop tube.

14. The system of claim 13, wherein each of the first, second, third and fourth solenoids is configured to create a magnetic force strong enough to overcome gravitational force and force resulting from a background magnetic field acting on the first and second ferromagnetic balls, respectively.

15. The system of claim 13, wherein the loop tube is formed of a non-magnetic metal.

16. A system for controlling transfer of thermal energy of a persistent current switch operating in a background magnetic field to a heat exchanger in thermal contact with a cryocooler, the system comprising:

a loop tube positioned between the persistent current switch and the heat exchanger, wherein coolant selectively flows through the loop tube;

a ball valve in the loop tube between the persistent current switch and the heat exchanger, the ball valve containing a ferromagnetic ball having a diameter greater than an inner diameter of the loop tube;

a first solenoid positioned outside the loop tube adjacent to a first side of the ball valve; and a second solenoid positioned outside the loop tube adjacent to a second side of the ball valve, wherein the loop tube comprises a first end portion formed of a ferromagnetic material that partially extends into the first side of the ball valve, and a second end portion formed of the ferromagnetic material that partially extends into the second side of the ball valve, the first end portion defining one or more through-holes in sidewalls of the first end portion located within the ball valve, wherein the first end portion and the second end portion are magnetized by the background magnetic field when the first solenoid and the second solenoid are not energized, wherein energizing the first solenoid at least partially demagnetizes the first end portion, causing the ferromagnetic ball to move to the magnetized second end portion, covering an opening of the loop tube within the ball valve and blocking the flow of the coolant, and wherein energizing the second solenoid at least partially demagnetizes the second end portion, causing the ferromagnetic ball to move to the magnetized first end portion, covering another opening of the loop tube within the ball valve and enabling the flow of the coolant through the one or more through-holes.

17. The system of claim 16, wherein each of the first end portion and the second end portion has substantially the same orientation as the background magnetic field.

18. The system of claim 16, wherein when the first solenoid is energized to at least partially demagnetize the first end portion, the second solenoid is energized with a reverse voltage, relative to a voltage used for energizing the first solenoid, further causing the ferromagnetic ball to move to the magnetized second end portion.

19. The system of claim 18, wherein when the second solenoid is energized to at least partially demagnetize the second end portion, the first solenoid is energized with a reverse voltage, relative to a voltage used for energizing the first solenoid, further causing the ferromagnetic ball to move to the magnetized first end portion.

20. The system of claim 16, wherein the loop tube, other than the first end portion and the second end portion, is formed of a non-magnetic material.

* * * * *